US009727271B2

(12) United States Patent
Lin et al.

(10) Patent No.: US 9,727,271 B2
(45) Date of Patent: *Aug. 8, 2017

(54) DATA STORAGE DEVICE AND FLASH MEMORY CONTROL METHOD

(71) Applicant: Silicon Motion, Inc., Jhubei, Hsinchu County (TW)

(72) Inventors: Chien-Cheng Lin, Yilan (TW); Chia-Chi Liang, Taichung (TW); Chang-Chieh Huang, Zhubei (TW); Jie-Hao Lee, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/437,543

(22) Filed: Feb. 21, 2017

(65) Prior Publication Data

US 2017/0160942 A1    Jun. 8, 2017

Related U.S. Application Data

(63) Continuation of application No. 14/534,603, filed on Nov. 6, 2014.

(Continued)

(51) Int. Cl.
*G06F 3/06* (2006.01)
*G11C 11/56* (2006.01)
(Continued)

(52) U.S. Cl.
CPC ............ *G06F 3/064* (2013.01); *G06F 3/0604* (2013.01); *G06F 3/0631* (2013.01);
(Continued)

(58) Field of Classification Search
CPC ...... G06F 3/064; G06F 3/0604; G06F 3/0631; G06F 3/0679; G06F 12/0802;
(Continued)

(56) References Cited

U.S. PATENT DOCUMENTS 6,895,490 B1    5/2005    Moore et al.
6,970,890 B1    11/2005    Bruce et al.
(Continued)

FOREIGN PATENT DOCUMENTS

CN    1518000 A    8/2004
CN    101123116 A    2/2008
(Continued)

OTHER PUBLICATIONS

Office Action dated May 26, 2016, issued in U.S. Appl. No. 14/534,686.
(Continued)

*Primary Examiner* — Rocio Del Mar Perez-Velez
(74) *Attorney, Agent, or Firm* — McClure, Qualey & Rodack, LLP

(57) ABSTRACT

A data storage device with flash memory and a flash memory control method are disclosed, in which the flash memory includes multi-level cells (MLCs) and single-level cells (SLCs). A microcontroller is configured to use the random access memory to cache data issued from the host before writing the data into the flash memory. The microcontroller is further configured to allocate the blocks of the flash memory to provide a first run-time write block containing multi-level cells and a second run-time write block containing single-level cells. Under control of the microcontroller, each physical page of data uploaded from the random access memory to the first run-time write block contains sequential data, and random data cached in the random access memory to form one physical page is written into the second run-time write block.

10 Claims, 6 Drawing Sheets

Related U.S. Application Data

(60) Provisional application No. 61/920,830, filed on Dec. 26, 2013.

(51) Int. Cl.
*G06F 12/08* (2016.01)
*G06F 12/0802* (2016.01)

(52) U.S. Cl.
CPC ........ *G06F 3/0679* (2013.01); *G06F 12/0802* (2013.01); *G11C 11/56* (2013.01); *G06F 2212/60* (2013.01); *G06F 2212/7202* (2013.01); *G11C 2211/5641* (2013.01)

(58) Field of Classification Search
CPC ......... G06F 2212/7202; G06F 2212/60; G11C 11/56; G11C 2211/5641
See application file for complete search history.

(56) References Cited

U.S. PATENT DOCUMENTS

| | | |
|---|---|---|
| 6,988,175 B2 | 1/2006 | Lasser |
| 7,603,525 B2 | 10/2009 | Lasser |
| 7,886,108 B2 | 2/2011 | Lee et al. |
| 7,904,635 B2 | 3/2011 | Deng et al. |
| 8,078,794 B2 | 12/2011 | Lee et al. |
| 8,352,706 B2 | 1/2013 | Yano et al. |
| 8,688,894 B2 | 4/2014 | Kuehne |
| 9,311,006 B2 | 4/2016 | Moshayedi |
| 9,355,028 B2 | 5/2016 | Cheng |
| 2003/0163630 A1 | 8/2003 | Aasheim et al. |
| 2004/0268063 A1 | 12/2004 | Lasser |
| 2006/0282644 A1 | 12/2006 | Wong |
| 2007/0021963 A1 | 1/2007 | Deng et al. |
| 2008/0104309 A1 | 5/2008 | Cheon et al. |
| 2008/0126680 A1 | 5/2008 | Lee et al. |
| 2008/0215800 A1 | 9/2008 | Lee et al. |
| 2008/0256287 A1 | 10/2008 | Lee et al. |
| 2009/0144501 A2 | 6/2009 | Yim et al. |
| 2009/0172262 A1 | 7/2009 | Olbrich et al. |
| 2009/0240871 A1 | 9/2009 | Yano et al. |
| 2009/0240873 A1 | 9/2009 | Yu et al. |
| 2009/0327589 A1 | 12/2009 | Moshayedi |
| 2009/0327591 A1 | 12/2009 | Moshayedi |
| 2009/0327840 A1 | 12/2009 | Moshayedi |
| 2010/0082883 A1 | 4/2010 | Chen et al. |
| 2010/0169551 A1 | 7/2010 | Yano et al. |
| 2010/0174851 A1 | 7/2010 | Leibowitz et al. |
| 2010/0257308 A1 | 10/2010 | Hsu et al. |
| 2010/0299494 A1 | 11/2010 | Van Acht et al. |
| 2010/0306451 A1 | 12/2010 | Johnson |
| 2011/0055458 A1 | 3/2011 | Kuehne |
| 2011/0087829 A1 | 4/2011 | Lin |
| 2011/0289255 A1 | 11/2011 | Wang et al. |
| 2012/0005415 A1* | 1/2012 | Jung .................. G06F 12/0246 711/103 |
| 2012/0239862 A1 | 9/2012 | Seo et al. |
| 2012/0297121 A1 | 11/2012 | Gorobets et al. |
| 2012/0311245 A1 | 12/2012 | Yano et al. |
| 2013/0304975 A1 | 11/2013 | Wang et al. |
| 2013/0326120 A1 | 12/2013 | Cheng |
| 2013/0326169 A1 | 12/2013 | Shaharabany et al. |
| 2014/0006898 A1 | 1/2014 | Sharon et al. |
| 2014/0101369 A1 | 4/2014 | Tomlin et al. |
| 2014/0122776 A1 | 5/2014 | El Maghraoui et al. |
| 2014/0136753 A1 | 5/2014 | Tomlin et al. |
| 2014/0244903 A1* | 8/2014 | Yano .................. G06F 12/0246 711/103 |
| 2015/0261444 A1 | 9/2015 | Yoshii et al. |

FOREIGN PATENT DOCUMENTS

| | | |
|---|---|---|
| CN | 101346704 A | 1/2009 |
| CN | 101667157 A | 3/2010 |
| CN | 102332290 A | 1/2012 |
| CN | 102591748 A | 7/2012 |
| CN | 102682848 A | 9/2012 |
| CN | 103150125 A | 6/2013 |
| CN | 102063377 B | 9/2013 |
| CN | 103455428 A | 12/2013 |
| CN | 103455437 A | 12/2013 |
| NO | 2012158514 A1 | 11/2012 |
| TW | 201142589 | 12/2011 |
| TW | 201305817 | 2/2013 |
| TW | 201348958 | 12/2013 |
| TW | 201348959 | 12/2013 |

OTHER PUBLICATIONS

Office Action dated Jun. 21, 2016, issued in U.S. Appl. No. 14/534,535.

Non-Final Office Action issued Jun. 30, 2016, in U.S. Appl. No. 14/534,633.

Non-Final Office Action mailed Apr. 18, 2016, issued in U.S. Appl. No. 14/534,488.

* cited by examiner

DATA STORAGE DEVICE AND FLASH MEMORY CONTROL METHOD

CROSS REFERENCE TO RELATED APPLICATIONS

This application is a Continuation of U.S. patent application Ser. No. 14/534,603, filed on Nov. 6, 2014, which claims the benefit of U.S. Provisional Application No. 61/920,830, filed Dec. 26, 2013, the entirety of which is incorporated by reference herein.

BACKGROUND OF THE INVENTION

Field of the Invention

The present invention relates to data storage devices with flash memory and flash memory control methods.

Description of the Related Art

Flash memory, a data storage medium, is common in today's data storage devices. For example, flash memory is typically used in memory cards, USB flash devices, solid-state drives, and so on. In another application with multi-chip package technology, a NAND flash chip and a controller chip are combined in one package as an embedded multi-media card (eMMC).

A flash memory device provides storage space which is divided into blocks, and each block includes a plurality of physical pages. An erase operation designed for flash memory is performed on a block-by-block basis, to release space one block at a time. When updating data, the new data is written into a spare space rather than being overwritten on the old data. Thus, it is more complex to manage a flash memory rather than other conventional storage mediums, especially if the flash memory architecture is more complex (comprising multi-level cells and single-level cells).

BRIEF SUMMARY OF THE INVENTION

A data storage device with flash memory and a flash memory control method are disclosed, in which the flash memory includes multi-level cells and single-level cells. The ways to separate the random data and the sequential data when writing data into the flash memory are shown.

A data storage device in accordance with an exemplary embodiment of the disclosure comprises a flash memory and a control unit. The flash memory includes multi-level cells and single-level cells and is divided into a plurality of blocks with each block comprising a plurality of physical pages. The control unit couples the flash memory to a host and comprises a microcontroller and a random access memory. The microcontroller is configured to use the random access memory to cache data issued from the host before writing the data into the flash memory. The microcontroller is further configured to allocate the blocks of the flash memory to provide a first run-time write block containing multi-level cells and a second run-time write block containing single-level cells. Under control of the microcontroller, each physical page of data uploaded from the random access memory to the first run-time write block contains sequential data, and random data cached in the random access memory to form one physical page is written into the second run-time write block.

A flash memory control method in accordance with an exemplary embodiment of the disclosure comprises the following steps: providing a random access memory for a flash memory including multi-level cells and single-level cells and divided into a plurality of blocks with each block comprising a plurality of physical pages; using the random access memory to cache data issued from a host before writing the data into the flash memory; and allocating the blocks of the flash memory to provide a first run-time write block containing multi-level cells and a second run-time write block containing single-level cells. Note that each physical page of data uploaded from the random access memory to the first run-time write block contains sequential data, and random data cached in the random access memory to form one physical page is written into the second run-time write block.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
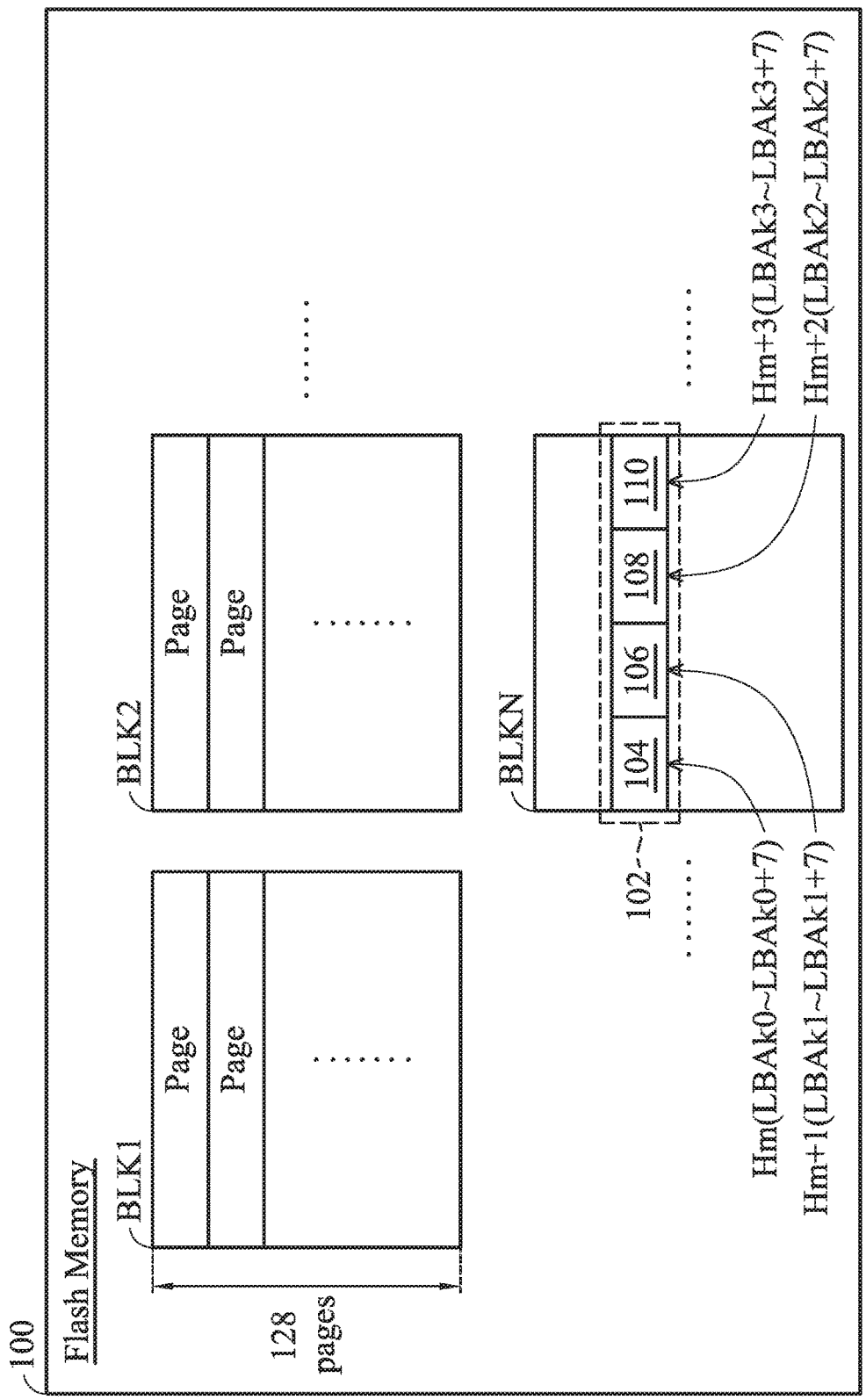
FIG. 1 depicts a storage space provided by a flash memory 100.

FIG. 1 depicts a storage space provided by a flash memory 100. The storage space provided by the flash memory 100 is divided into blocks (e.g., BLK1, BLK2 . . . BLKN . . . ). Each block includes a plurality of physical pages. Each physical page includes a plurality of sectors. For example, physical page 102 provided within block BLKN includes four sectors 104, 106, 108 and 110. When each sector is allocated to store user data of one host page (corresponding to a series of logical addresses, e.g. LBAk to LBAk+7), each physical page stores four host pages. For example, the four sectors 104, 106, 108 and 110 correspond to four host pages Hm (i.e. from LBAk0 to LBAk0+7), Hm+1 (i.e. from LBAk1 to LBAk1+7). Hm+2 (i.e. from LBAk2 to LBAk2+7) and Hm+3 (i.e. from LBAk3 to LBAk3+7), respectively. The four host pages stored into one physical page may be random data or sequential data. For example, when the four host pages Hm, Hm+1, Hm+2 and Hm+3 stored into the physical page 102 contain random data, the logical address LBAk1 is not sequential to the logical address LBAk0+7, or the logical address LBAk2 is not sequential to the logical address LBAk1+7, or the logical address LBAk3 is not sequential to the logical address LBAk2+7. When the four host pages Hm, Hm+1, Hm+2 and Hm+3 stored into the physical page 102 contain sequential data, the logical address LBAk1 is sequential to the logical address LBAk0+7, and the logical address LBAk2 is sequential to the logical address LBAk1+7, and the logical address LBAk3 is sequential to the logical address LBAk2+7. In the disclosure, the ways to separate the random data and the sequential data when writing data into the flash memory 100 are shown.

Figure 2A:
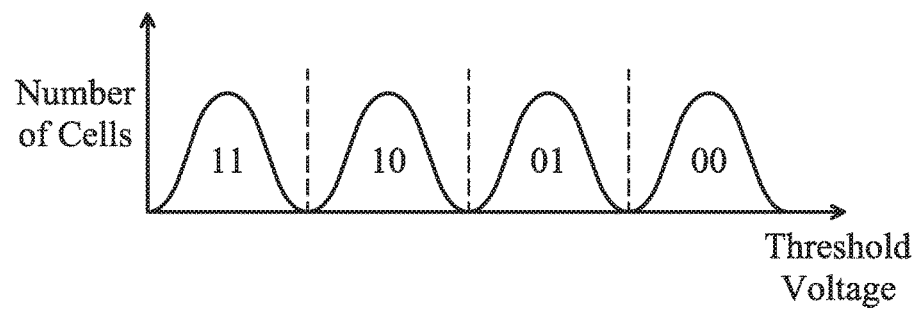
FIG. 2A illustrates the cell distribution of multi-level cells (MLCs)
Figure 2B:
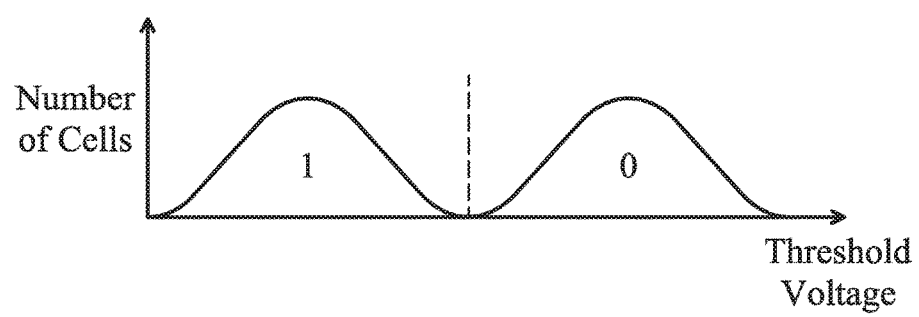
FIG. 2B illustrates the cell distribution of single-level cells (SLCs)

FIG. 2A illustrates the cell distribution of multi-level cells (MLCs) and FIG. 2B illustrates the cell distribution of single-level cells (SLCs). Referring to FIG. 2A, two bits are programmed per MLC, and each MLC exists in one of the four states '11', '10', '01' and '00'. Referring to FIG. 2B, one bit is programmed per SLC, and each SLC exists in one of the two states '1' and '0'. The SLCs have the advantage of faster write speeds, lower power consumption and higher cell endurance. The primary benefit of the MLCs is the higher data density. In a default setting in accordance with an exemplary embodiment of the disclosure, data is stored into the SLCs for the faster write speeds, lower power consumption and higher cell endurance. However, when it is determined that the write data is sequential data, the write data is written into the MLCs rather than the SLCs for the higher data density.

Figure 3:
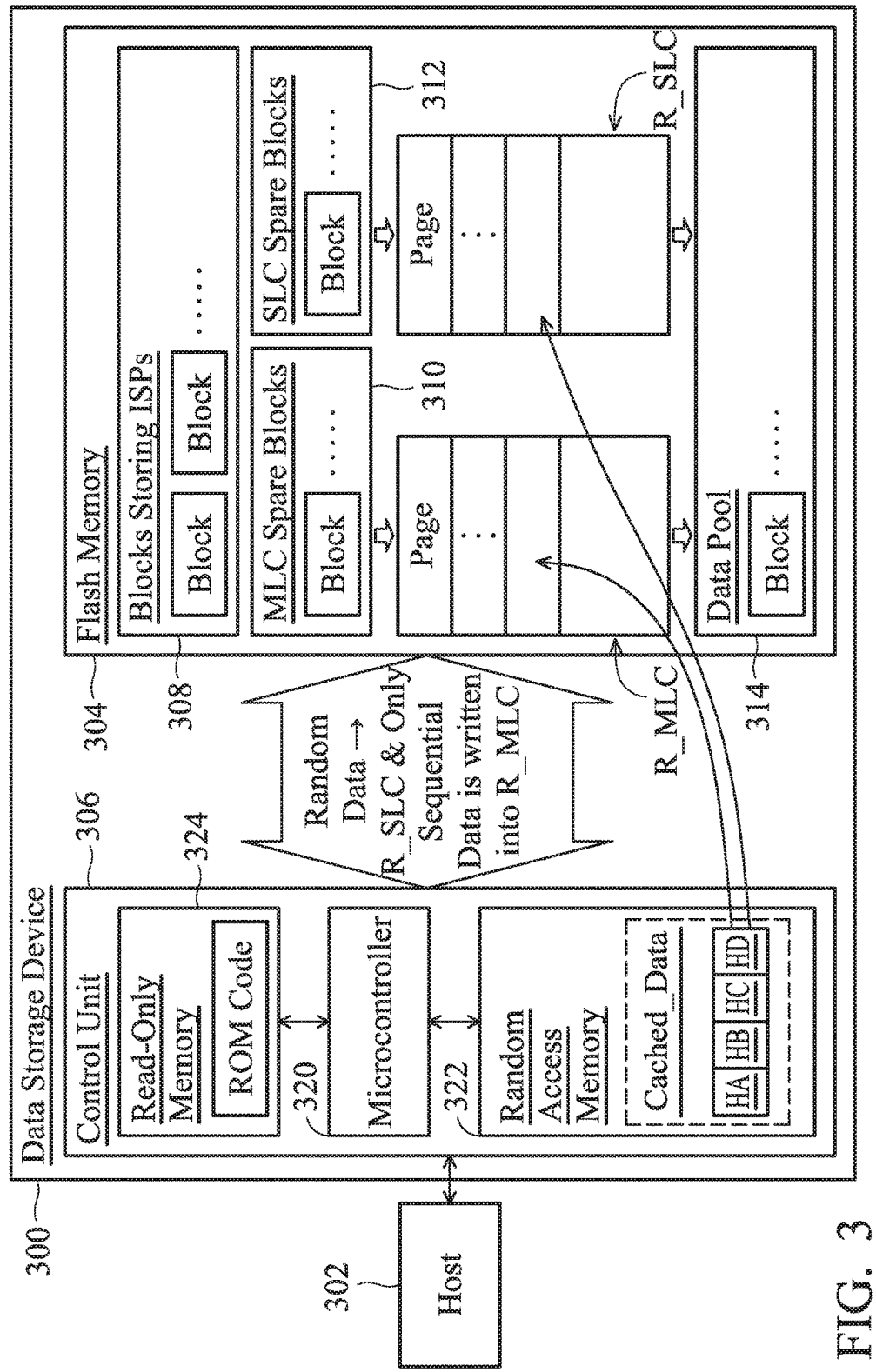
FIG. 3 is a block diagram depicting a data storage device 300 in accordance with an exemplary embodiment of the disclosure.

FIG. 3 is a block diagram depicting a data storage device 300 in accordance with an exemplary embodiment of the disclosure. The data storage device 300 is coupled to a host 302 to be operated according to commands from the host 302. The data storage device 300 includes a flash memory 304 as well as a control unit 306. A way to separate the random data and the sequential data when writing data into the flash memory 304 is shown.

In the flash memory 304, the blocks are allocated for several purposes. Blocks 308 store in-system programs (ISPs). Blocks 310 are spare blocks containing MLCs. Blocks 312 are spare blocks containing SLCs. Two run-time write blocks R_MLC and R_SLC are allocated from the spare blocks 310 (containing MLCs) and the spare blocks 312 (containing SLCs), respectively, for reception of write data, which will be pushed into the data pool 314 as data blocks. The flash memory 304 may further contain free blocks not shown in the figure.

The control unit 306 coupling the flash memory 304 to the host 302 comprises a microcontroller 320, a random access memory 322 and a read-only memory 324. A ROM code is stored in the read-only memory 324. The microcontroller 320 is configured to operate the flash memory 304 by executing the ROM code stored in the read-only memory 324 or/and by executing the ISPs stored in the blocks 308 of the flash memory 304. The control and management of the flash memory 304 are discussed in the following paragraphs.

The microcontroller 320 is configured to perform the block allocation of the flash memory 304 (e.g. allocating the flash memory 304 to provide the two run-time write blocks R_MLC and R_SLC). The microcontroller 320 is further configured to use the random access memory 322 to collect data issued from the host 302 before writing the data into the flash memory 304. As shown, four host pages HA, HB. HC and HD cached in the random access memory 322 are combined together as one physical page of data Cached_Data to be written into one physical page of the flash memory 304. According to the microcontroller 320, each physical page of data uploaded from the random access memory 322 to the run-time write block R_MLC contains sequential data, and random data cached in the random access memory 322 to form one physical page is written into the run-time write block R_SLC.

Figure 4:
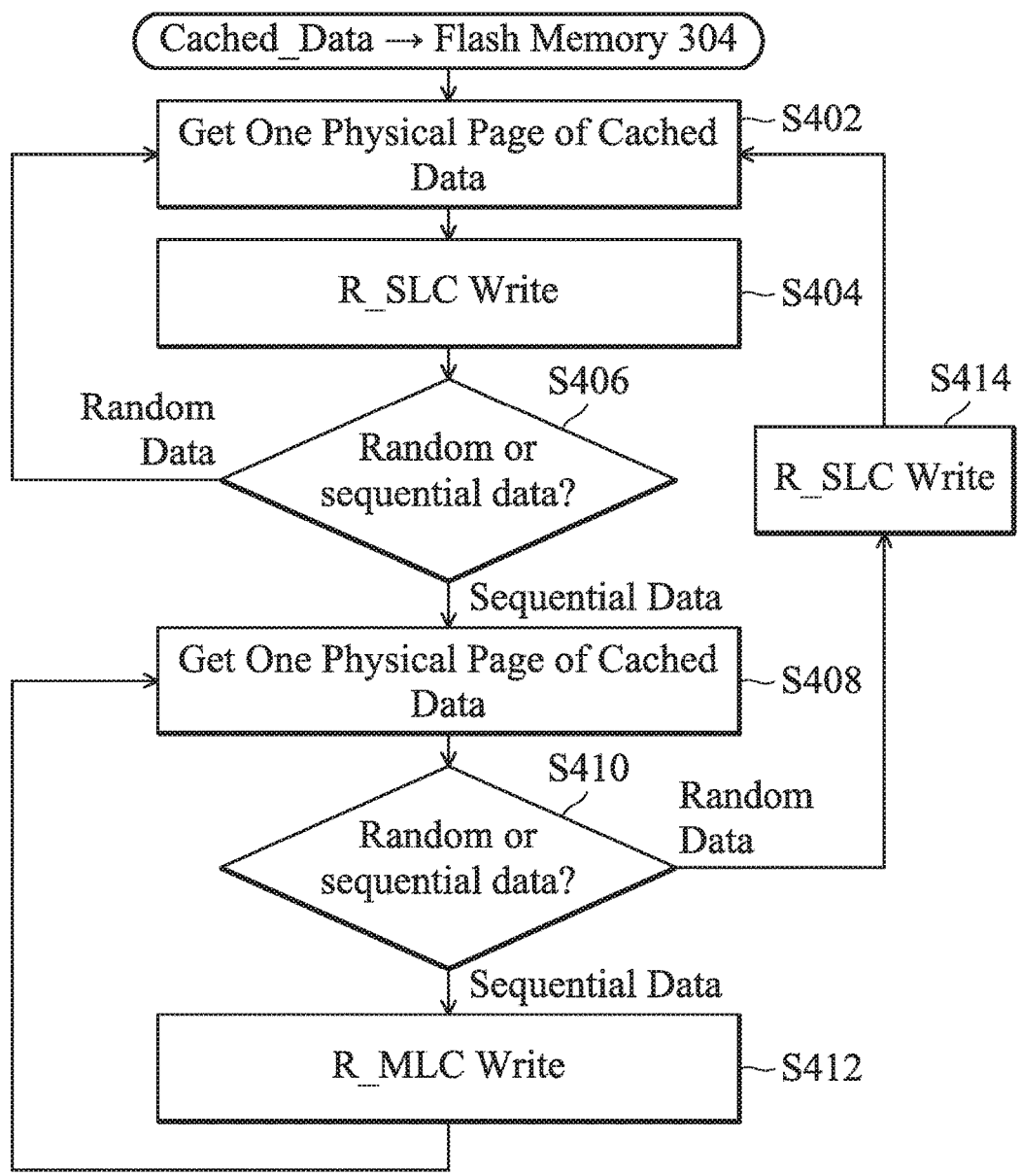
FIG. 4 is a flowchart depicting how to upload one physical page of cached data Cached_Data from the random access memory 322 to the flash memory 304 in accordance with an exemplary embodiment of the disclosure.

FIG. 4 is a flowchart depicting how to upload one physical page of cached data Cached_Data from the random access memory 322 to the flash memory 304 in accordance with an exemplary embodiment of the disclosure. As shown in steps S402 and S404, the default setting is to write the physical page of cached data Cached_Data into the run-time write block R_SLC for faster write speeds, lower power consumption and higher cell endurance and so on. After step S404, which writes one physical page of cached data into the run-time write block R_SLC, step S406 is performed to check the data type of the physical page that has been uploaded from the random access memory 322 to the run-time write block R_SLC in step S404. When it is determined in step S406 that the physical page that has been uploaded from the random access memory 322 to the run-time write block R_SLC in step S404 contains random data, steps S402 and S404 and S406 are repeated again. When it is determined in step S406 that the physical page that has been uploaded from the random access memory 322 to the run-time write block R_SLC in step S404 contains sequential data, step S408 is performed to get another physical page of cached data from the random access memory 322 and step S410 is performed to check the data type of the another physical page of cached data that is obtained from the random access memory 322 in step S408. When it is determined in step S410 that the physical page of cached data obtained from the random access memory 322 in step S408 contains random data, step S414 is performed to write the physical page of cached data obtained from the random access memory 322 in step S408 to the run-time write block R_SLC. After step S414, steps S402, S404 and S406 are repeated. When it is determined in step S410 that the physical page of cached data obtained from the random access memory 322 in step S408 contains sequential data, step S412 is performed to write the physical page of cached data obtained from the random access memory 322 in step S408 to the run-time write block R_MLC. After step S412, steps S408 and S410 are repeated.

According to the flowchart of FIG. 4, the microcontroller 320 is configured to check data type (e.g. step S410) before writing data into the run-time write block R_MLC (step S412), to ensure that each physical page of data uploaded from the random access memory 322 to the run-time write block R_MLC contains sequential data. When a physical page of data (hereinafter "Cached_DataA") uploaded from the random access memory 322 to the run-time write block R_SLC contains random data, the microcontroller 320 is configured to write a physical page of data (hereinafter "Cached_DataB") cached in the random access memory 322 later than Cached_DataA into the run-time write block R_SLC, e.g. step S404. The microcontroller 320 is further configured to check whether the Cached_DataB contains sequential data or random data (e.g. S406) to speculate about the data type of a physical page of data (hereinafter "Cached_DataC") cached in the random access memory 322 later than Cached_DataB. When Cached_DataB contains random data, the microcontroller 320 is configured to speculate that Cached_DataC contains random data and writes Cached_DataC into the run-time write block R_SLC (e.g. step S404). When Cached_DataB contains sequential data, the microcontroller 320 is configured to check the data type of Cached_DataC (e.g. step S410) prior to writing Cached_DataC into the flash memory 304. When Cached_DataC is confirmed to be containing sequential data, the microcontroller 320 is configured to write Cached_DataC into the run-time write block R_MLC (e.g. step S412). When Cached_DataC is confirmed to be containing random data, the microcontroller 320 is configured to write Cached_DataC into the run-time write block R_SLC (e.g. step S414).

Figure 5A:
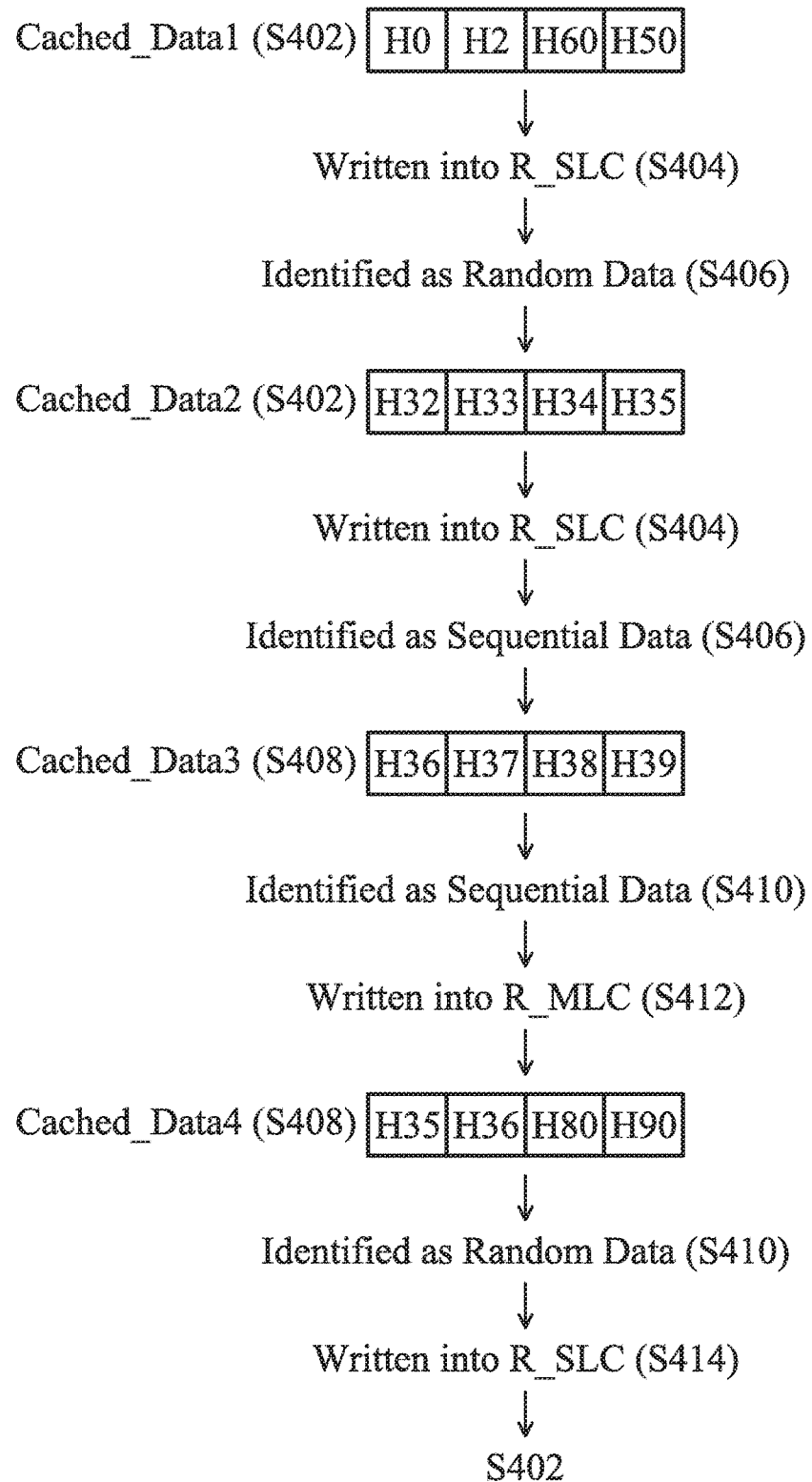
FIG. 5A shows how a series of cached data are written into the flash memory 304 with respect to the flowchart of FIG. 4.
Figure 5B:
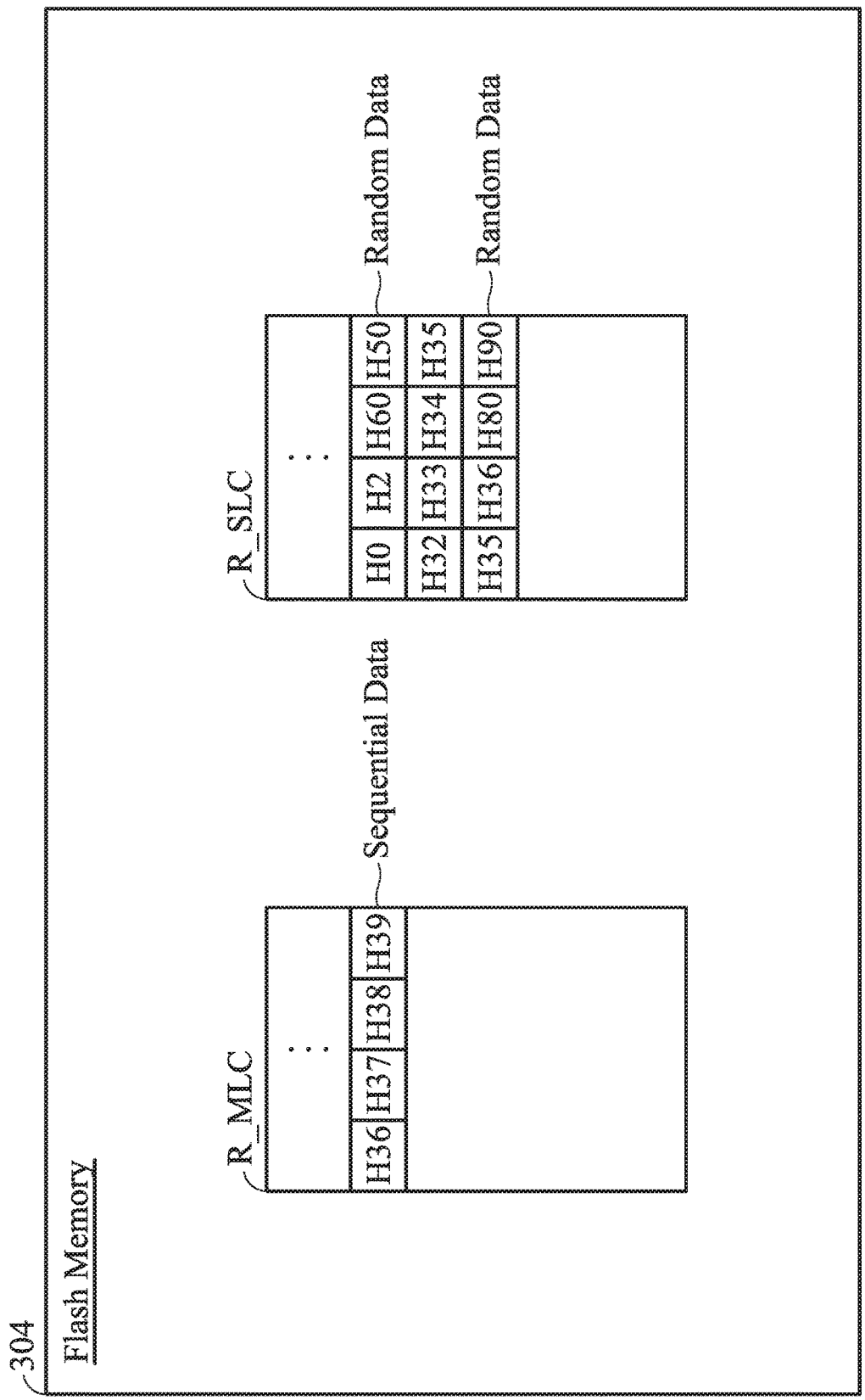
FIG. 5B shows how a series of cached data are written into the flash memory 304 with respect to the flowchart of FIG. 4.

FIG. 5A and FIG. 5B show how a series of cached data are written into the flash memory 304 with respect to the flowchart of FIG. 4. First, one physical page of cached data Cached_Data1 containing host pages H0, H2, H60 and H50 are retrieved from the random access memory 322 by step S402. The physical page of cached data Cached_Data1 is written into the run-time write block R_SLC in step S404, and it is determined in step S406 that the physical page of cached data Cached_Data1 contains random data. Thus, step S402 is repeated and another physical page of cached data Cached_Data2 containing host pages H32, H33, H34 and H35 are retrieved from the random access memory 322. The physical page of cached data Cached_Data2 is written into the run-time write block R_SLC in step S404, and it is determined in step S406 that the physical page of cached data Cached_Data2 contains sequential data. Thus, step S408 is performed to retrieve the next physical page of cached data Cached_Data3 containing host pages H36, H37, H38 and H39 from the random access memory 322. It is determined in step S410 that the physical page of cached data Cached_Data3 contains sequential data. Thus, step S412 is performed to write the physical page of cached data Cached_Data3 into the run-time write block R_MLC. Then, step S408 is repeated to retrieve the next physical page of cached data Cached_Data4 containing host pages H35. H36, H80 and H90 from the random access memory 322. It is determined in step S410 that the physical page of cached data Cached_Data4 contains random data. Thus, step S414 is performed to write the physical page of cached data Cached_Data4 into the run-time write block R_SLC. Then, step S402 is repeated. Referring to FIG. 5B, the run-time write block R_MLC stores only sequential data, and random data is certainly written into the run-time write block R_SLC.

Any technique using the aforementioned concept to control a flash memory is within the scope of the invention. The invention further involves flash memory control methods, which are not limited to any specific controller architecture.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory including multi-level cells and single-level cells, wherein the flash memory is divided into a plurality of blocks with each block comprising a plurality of physical pages; and
   a control unit, coupling the flash memory to a host and comprising a microcontroller and a random access memory,
   wherein:
   the microcontroller is configured to use the random access memory to cache data issued from the host before writing the data into the flash memory;
   the microcontroller is further configured to allocate the blocks of the flash memory to provide a first run-time write block containing multi-level cells and a second run-time write block containing single-level cells; each physical page of data uploaded from the random access memory to the first run-time write block contains sequential data;
   random data cached in the random access memory to form one physical page is written into the second run-time write block; and
   when determining that a first physical page of data that has been uploaded from the random access memory to the second run-time write block contains random data, the microcontroller is configured to write a second physical page of data, cached in the random access memory after the first physical page of data, into the second run-time write block, before checking whether the second physical page of data contains random or sequential data.

2. The data storage device as claimed in claim 1, wherein:
   the microcontroller is configured to check data type before writing data into the first run-time write block, to ensure that each physical page of data uploaded from the random access memory to the first run-time write block contains sequential data.

3. The data storage device as claimed in claim 1, wherein:
   the microcontroller is further configured to check whether the second physical page of data contains sequential data or random data to speculate about data type of a third physical page of data cached in the random access memory later than the second physical page of data.

4. The data storage device as claimed in claim 3, wherein:
   when the second physical page of data contains random data, the microcontroller is configured to speculate that the third physical page of data contains random data and writes the third physical page of data into the second run-time write block.

5. The data storage device as claimed in claim 3, wherein:
   when the second physical page of data contains sequential data, the microcontroller is configured to check data type of the third physical page of data prior to writing the third physical page of data into the flash memory;
   when the third physical page of data is confirmed to be containing sequential data, the microcontroller is configured to write the third physical page of data into the first run-time write block; and
   when the third physical page of data is confirmed to be containing random data, the microcontroller is configured to write the third physical page of data into the second run-time write block.

6. A flash memory control method, comprising:
   providing a random access memory for a flash memory, wherein the flash memory includes multi-level cells and single-level cells and is divided into a plurality of blocks with each block comprising a plurality of physical pages;
   using the random access memory to cache data issued from a host before writing the data into the flash memory; and
   allocating the blocks of the flash memory to provide a first run-time write block containing multi-level cells and a second run-time write block containing single-level cells,
   wherein:
   each physical page of data uploaded from the random access memory to the first run-time write block contains sequential data;

random data cached in the random access memory to form one physical page is written into the second run-time write block; and when determining that a first physical page of data that has been uploaded from the random access memory to the second run-time write block contains random data, a second physical page of data cached in the random access memory after the first physical page of data is written into the second run-time write block, before checking whether the second physical page of data contains random or sequential data.

7. The flash memory control method as claimed in claim 6, further comprising:

checking data type before writing data into the first run-time write block, to ensure that each physical page of data uploaded from the random access memory to the first run-time write block contains sequential data.

8. The flash memory control method as claimed in claim 6, further comprising:

checking whether the second physical page of data contains sequential data or random data to speculate about data type of a third physical page of data cached in the random access memory later than the second physical page of data.

9. The flash memory control method as claimed in claim 8, further comprising:

when the second physical page of data contains random data, speculating that the third physical page of data contains random data and writing the third physical page of data into the second run-time write block.

10. The flash memory control method as claimed in claim 8, wherein:

when the second physical page of data contains sequential data, data type of the third physical page of data is checked prior to writing the third physical page of data into the flash memory:

when the third physical page of data is confirmed to be containing sequential data, the third physical page of data is written into the first run-time write block; and when the third physical page of data is confirmed to be containing random data, the third physical page of data is written into the second run-time write block.

* * * * *